United States Patent
Koizumi et al.

(10) Patent No.: US 6,297,842 B1
(45) Date of Patent: Oct. 2, 2001

(54) ORGANIC ELECTROLUMINESCENT LIGHT-EMITTING ARRAY AND OPTICAL HEAD ASSEMBLY

(75) Inventors: Masumi Koizumi; Yichao Jiang; Tsutomu Nomoto; Ichimatsu Abiko, all of Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 08/531,753

(22) Filed: Sep. 21, 1995

(30) Foreign Application Priority Data

Sep. 27, 1994 (JP) .................................... 6-231507

(51) Int. Cl.[7] ............................. B41J 2/447; H01L 33/00
(52) U.S. Cl. ............................. 347/237; 347/238; 257/88
(58) Field of Search .................................... 347/235–238, 347/163; 428/690; 355/67; 315/87; 345/76, 36, 82; 257/88, 40, 99

(56) References Cited

U.S. PATENT DOCUMENTS

| | | | |
|---|---|---|---|
| 3,665,246 | * 5/1972 | Kurahashi et al. | ........... 315/169.3 |
| 4,829,321 | 5/1989 | Iizuka et al. | . |
| 4,887,098 | * 12/1989 | Hawkins et al. | .............. 347/58 |
| 5,099,301 | 3/1992 | Kikinis | . |
| 5,133,036 | * 7/1992 | Tornqvist | ............... 385/130 |
| 5,179,316 | * 1/1993 | Kellam | ................... 313/499 |
| 5,371,525 | * 12/1994 | Murano | .............. 347/237 X |
| 5,405,710 | * 4/1995 | Dodabalapur et al. | ............ 428/690 |
| 5,457,565 | * 10/1995 | Namiki et al. | ............. 359/273 |
| 5,600,363 | * 2/1997 | Anzaki et al. | ............. 347/237 |
| 5,610,685 | * 3/1997 | Aiba | ....................... 355/67 |
| 5,612,549 | * 3/1997 | Nelson et al. | .............. 257/88 |
| 5,635,308 | * 6/1997 | Inoue et al. | ............. 428/690 |
| 5,652,067 | * 7/1997 | Ito et al. | ................ 428/690 |
| 5,661,371 | * 8/1997 | Salerno et al. | ............ 315/169.3 |
| 5,693,962 | * 12/1997 | Shi et al. | .................. 257/89 |
| 5,705,826 | * 1/1998 | Aratani et al. | ............... 257/40 |
| 5,734,406 | * 3/1998 | Nakamura et al. | ............. 347/132 |
| 5,736,754 | * 4/1998 | Shi et al. | .................. 257/89 |

FOREIGN PATENT DOCUMENTS

| | | |
|---|---|---|
| 572 779 | 12/1993 | (EP) . |
| 0 687 019 | 12/1995 | (EP) . |
| 4-71194 | 3/1992 | (JP) . |
| 4-280095 | 6/1992 | (JP) . |
| 4-270666 | 9/1992 | (JP) . |

OTHER PUBLICATIONS

Torikeppusu WS 6 (Oct., 1985), pp. 114–140, "LED Array Development and Printer Development", Sakaguchi et al.

Applied Physics Letters, Aug. 6, 1990, vol. 57, No. 6, pp. 531–533, "Confinement of Charge Carriers and Molecular Excitons Within 5–NM–Thick Emitter Layer in Organic Electroluminescent Devices with a Double Heterostructure", Chihaya Adachi et al.

Applied Physics Letters, May 16, 1994, vol. 64, No. 20, pp. 2718–2720, "Metal Ion Dependent Luminescence Effects in Metal Tris–Quinolate Organic Heterojunction Light Emitting Devices", P. E. Burrows et al.

Japanese Journal of Applied Physics, May 1, 1992, vol. 31, No. 5A, pp. L568–L570, "Time–Resolved Pulse Response of Electroluminescent in Poly(3–Alkylthiophene) Diodes", Yutaka Ohmori et al.

* cited by examiner

Primary Examiner—David F. Yockey
(74) Attorney, Agent, or Firm—Venable; Robert J. Frank; Michael A. Sartori

(57) ABSTRACT

A light-emitting array and its driving circuitry are integrated into a single device. The driving circuitry is formed in a semiconductor substrate and has an array of output terminals on a surface of the substrate. Organic electroluminescent elements are formed directly over the output terminals, in electrical contact with the output terminals. The electroluminescent elements are driven by direct current. An optical head assembly has one or more of these light-emitting arrays mounted on a printed circuit board.

36 Claims, 15 Drawing Sheets

ORGANIC ELECTROLUMINESCENT LIGHT-EMITTING ARRAY AND OPTICAL HEAD ASSEMBLY

BACKGROUND OF THE INVENTION

The present invention relates to an array of light-emitting elements and an optical head assembly, more particularly to an array and assembly employing organic electroluminescent (EL) elements.

One well-known application of light-emitting arrays is in the optical heads of electrophotographic printers. Linear arrays of light-emitting diodes (LEDs) have long been applied in this way, for example. The optical head assembly of a typical LED printer comprises a printed circuit board on which are mounted a plurality of LED array devices and their driver integrated circuits (ICs). The diodes in the arrays form an image by illuminating a photosensitive drum.

This LED printing technology is limited in resolution, however, because the LED array devices and their driver ICs are interconnected by wire bonding. A separate bonding wire is required for each LED. Mutual contact between different bonding wires must naturally be avoided, so the LEDs cannot be spaced too closely together. Even if driver ICs are provided on both sides of the LED arrays, so that the bonding wires can be placed alternately on one side and the other, high dot resolution (higher than six hundred dots per inch, for example) appears to be unachievable.

Resolution is not the only problem in the use of LED arrays. Assembly of the optical head is time-consuming and difficult, because even at the comparatively moderate resolution of three hundred dots per inch, printing on standard letter-size (or A4 size) paper requires a row of over two thousand dots, so there are over two thousand bonding wires to be individually attached. Moreover, since each LED array typically provides only sixty-four LEDs, there are some forty LED array devices and a similar number of driver ICs to be individually die-bonded to the printed-circuit board, in precise positional relationships to one another.

Reliability is a further problem: with over two thousand closely-spaced bonding wires, it is difficult to ensure that no pair of adjacent bonding wires will make mutual contact. Cost is also a problem. Fabrication of the LED arrays is expensive, because a compound semiconductor such as gallium arsenide (GaAs) is employed, and the small size of compound semiconductor wafers permits comparatively few arrays to be fabricated per wafer, driving up the cost per array.

Use of arrays of zinc-sulfide (ZnS) light-emitting elements has also been proposed. Zinc sulfide is an electroluminescent material that can be deposited directly onto the surface of a driver IC, eliminating the need for separate array and driver devices. A ZnS light-emitting element, however, is not as easily driven as a LED. The necessary drive voltage is measured in tens of volts and may exceed one hundred volts, so special drive circuitry capable of withstanding high voltages must be provided. Furthermore, an alternating-current power supply must generally be employed, instead of the direct-current supplies normally used with integrated circuits.

SUMMARY OF THE INVENTION

It is accordingly an object of the present invention to increase the dot resolution of an array of light-emitting elements.

A further object of the invention is to simplify the driving of an array of light-emitting elements.

Another object is to reduce the cost of manufacturing an array of light-emitting elements.

Still another object is to simplify the manufacture of an optical head assembly.

Yet another object is to reduce the cost of an optical head assembly.

Still another object is to improve the reliability of an optical head assembly.

The invented light-emitting array comprises a semiconductor substrate having a surface on which a plurality of output terminals are formed. Organic electroluminescent elements are created over these output terminals, in electrical contact with the output terminals. The electroluminescent elements are driven by an integrated circuit formed in the semiconductor substrate, which supplies direct current at a certain voltage to each of the output terminals, and switches this current on and off at each output terminal individually.

The invented optical head assembly has at least one of the invented light-emitting arrays mounted on a printed circuit board.

DETAILED DESCRIPTION OF THE INVENTION

Embodiments of the invented light-emitting array and optical head will now be described with reference to the attached illustrative drawings. FIGS. 1 to 4 apply to all of the illustrated embodiments of the invented light-emitting array.

Figure 1:
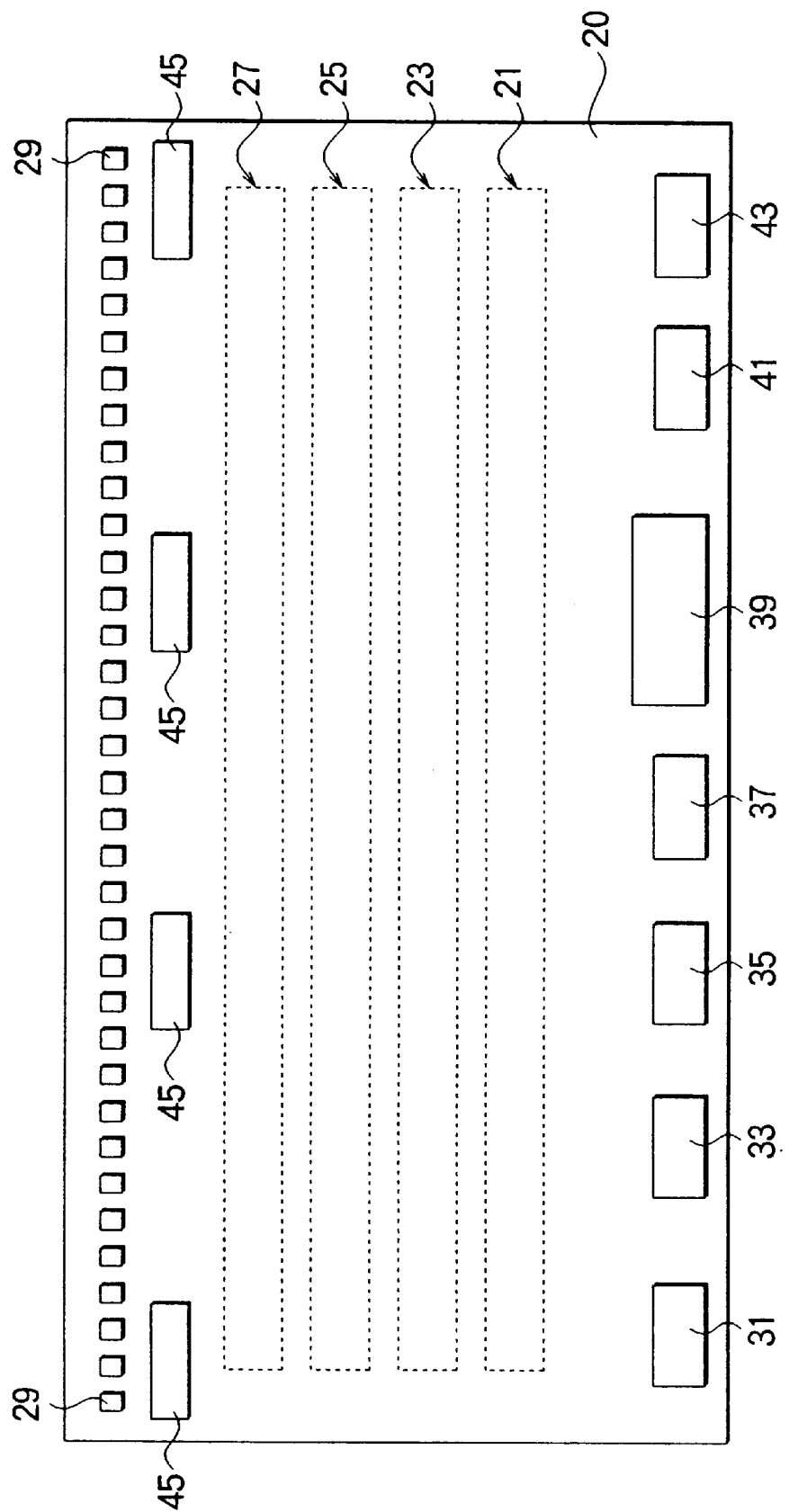
FIG. 1 is a plan view of the invented light-emitting array, showing the surface of the driver IC without the electroluminescent elements.

The invented light-emitting array comprises an integrated circuit, referred to below as the driver IC, with organic electroluminescent elements formed on one surface. FIG. 1 shows this surface of the driver IC 20, with the electroluminescent elements removed for better visibility of the IC structure. The integrated circuit comprises a shift register 21, a latch circuit 23, a logic circuit 25, a drive circuit 27, and a plurality of output terminals 29. The output terminals 29 are electrically coupled to respective drive elements such as transistors in the drive circuit 27. The internal structure of the shift register 21, latch circuit 23, logic circuit 25, and drive circuit 27 will not be described, as these circuits are well known.

Also shown in FIG. 1 are a clock signal input pad 31, data signal input pad 33, load signal input pad 35, strobe signal input pad 37, power supply pad 39, clock signal output pad 41, data signal output pad 43, and four common return pads 45. The sizes and shapes of these pads may vary depending on the design, but the power supply pad 39 and common return pads 45 are preferably of sufficient size to permit the connection of a plurality of bonding wires, because these pads carry the direct-current flow that powers all the electroluminescent elements.

Figure 2:
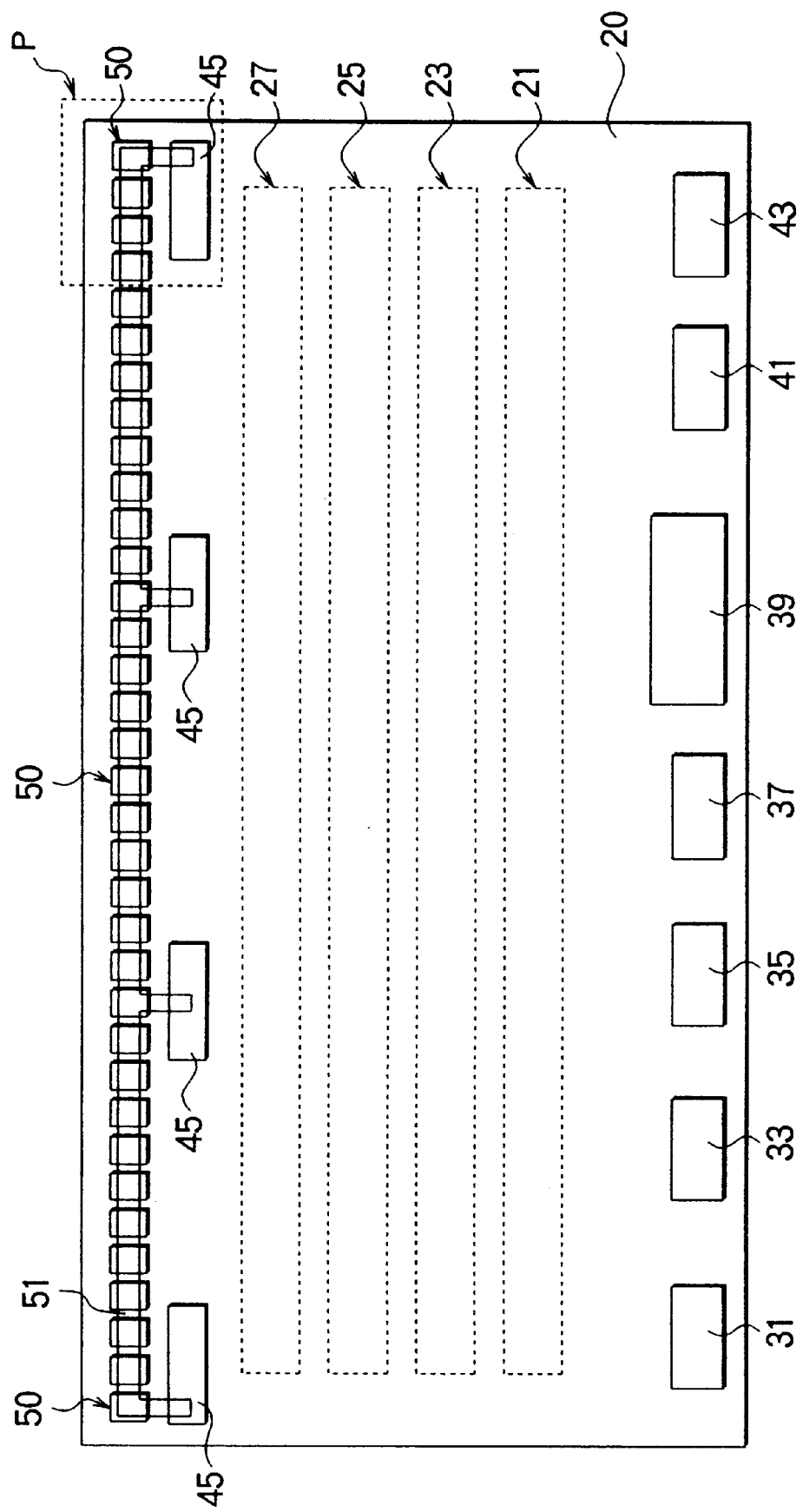
FIG. 2 is a plan view of the same light-emitting array, showing the electroluminescent elements.

FIG. 2 shows the invented light-emitting array with the organic electroluminescent elements 50 in place. Components of the driver IC 20 are identified by the same reference numerals as in FIG. 1. One organic electroluminescent element 50 is formed over each of the output terminals 29 that were shown in FIG. 1. A common electrode 51 electrically couples all of the electroluminescent elements 50 to all of the common return pads 45. The reason for having multiple common return pads 45 is to reduce the voltage drop that occurs along the length of the common electrode 51 due to the resistance of the common electrode 51.

Figure 3:
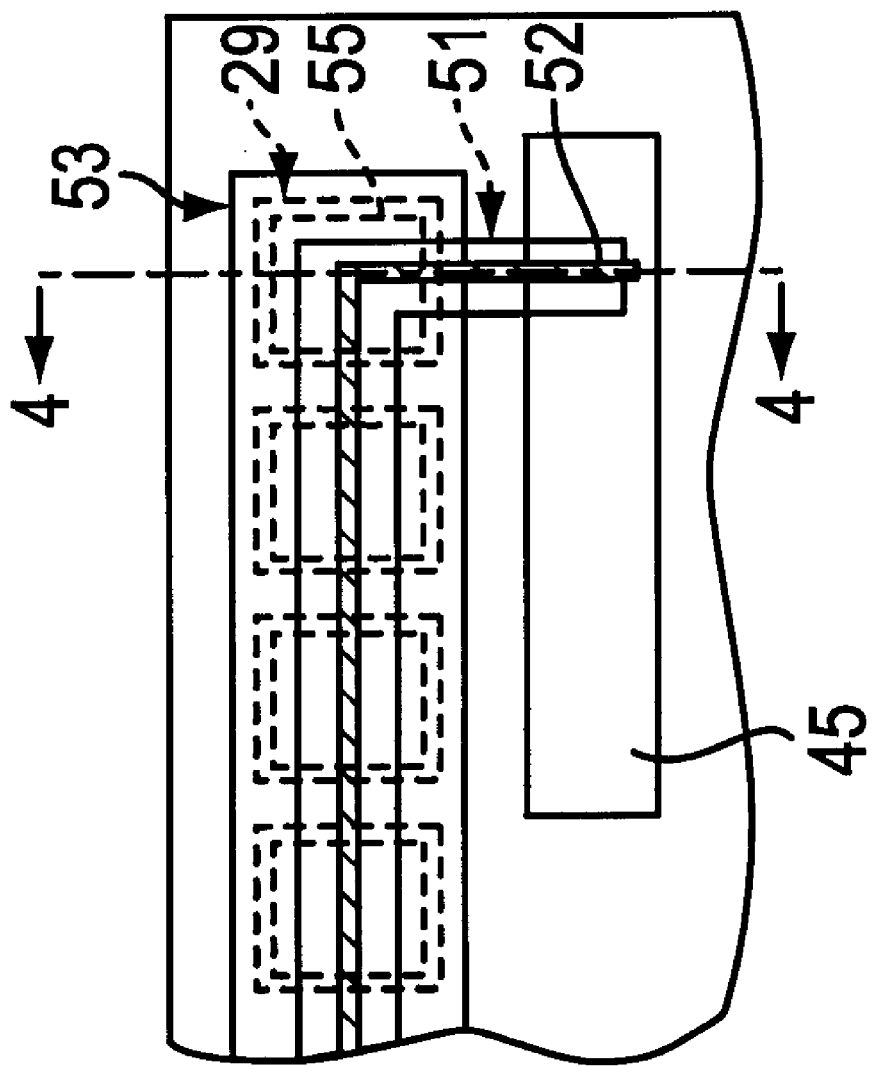
FIG. 3 is an enlarged plan view of the section marked P in FIG. 2.

FIG. 3 is an enlarged plan view of the part marked P in FIG. 2, showing the structure of the organic electroluminescent elements in more detail. As can be seen in FIG. 3, a common metal electrode 52 runs as a longitudinal stripe down the center of the common electrode 51. The common metal electrode 52 further reduces the voltage drop along the length of the common electrode 51, and provides protection against possible open circuits that might form in the common electrode 51 due to irregularities in the underlying surface.

The common electrode 51 makes electrical contact with an organic electroluminescent film 53, which extends the length of the light-emitting array. This film will be referred to below as an organic EL film. Electrical connection between the organic EL film 53 and each output terminal 29 is effected by a corresponding individual electrode 55. A single organic electroluminescent element consists of one individual electrode 55 and the part of the organic EL film 53 and common electrode 51 disposed over or Immediately adjacent to that individual electrode 55.

Figure 4:
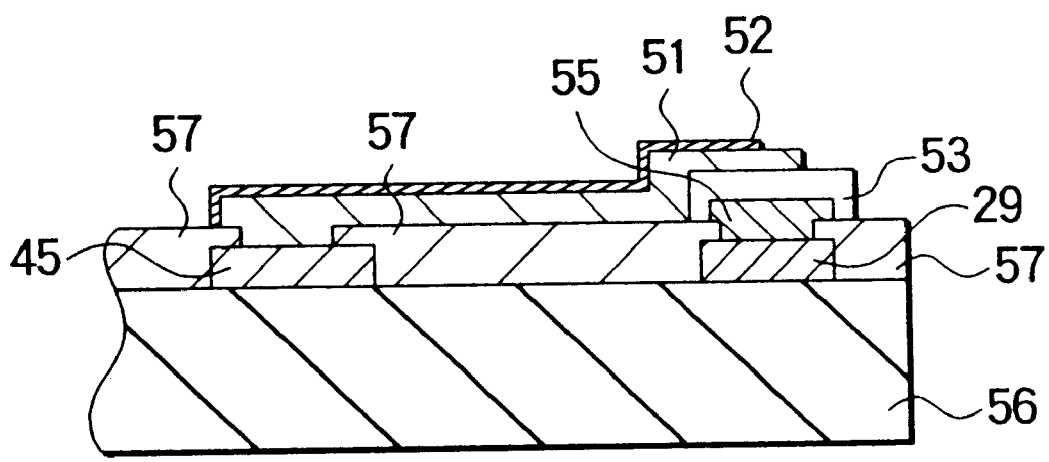
FIG. 4 is a sectional view through line 4—4 in FIG. 3.

FIG. 4 is a sectional view through line 4—4 in FIG. 3, omitting the circuits of the driver IC for simplicity. These circuits are formed in a semiconductor substrate 56, the output terminals 29 being formed on the surface of the substrate 56. A protective layer 57 on the surface of the substrate 56 protects the underlying integrated circuit, and insulates the circuit elements (not shown) from the common electrode 51 and common metal electrode 52.

An electrode with a large work function is required on the anode side of the electroluminescent element 50, and an electrode with a small work function is required on the cathode side. The output terminals 29 of the silicon integrated circuits are generally fabricated from a metal-silicon alloy such as aluminum-silicon (Al—Si) or aluminum-silicon-copper (Al—Si—Cu), which has a large work function. This presents a problem when the output terminals 29 are on the cathode side, as in the first six embodiments described below.

The individual electrodes 55 are a solution to this problem. Made of a material having a small work function, such as an aluminum-lithium or magnesium-silver alloy, they provide a suitable electrical interface between the output terminals 29 and organic EL film 53.

An alternative solution is to make the output terminals 29 themselves from a material having a small work function, such as an aluminum-lithium alloy, or to make at least an upper layer of the output terminals 29 from such a material. In that case the organic EL film 53 can make direct contact with the output terminals 29, and the individual electrodes 55 are unnecessary. This alternative solution has the advantage of simplifying the fabrication process.

The individual electrodes 55 can also be omitted when the output terminals 29 are on the anode side of the electroluminescent elements 50, as will be shown in the seventh embodiment. In that case the common electrode 51 has a small work function.

Figure 5:
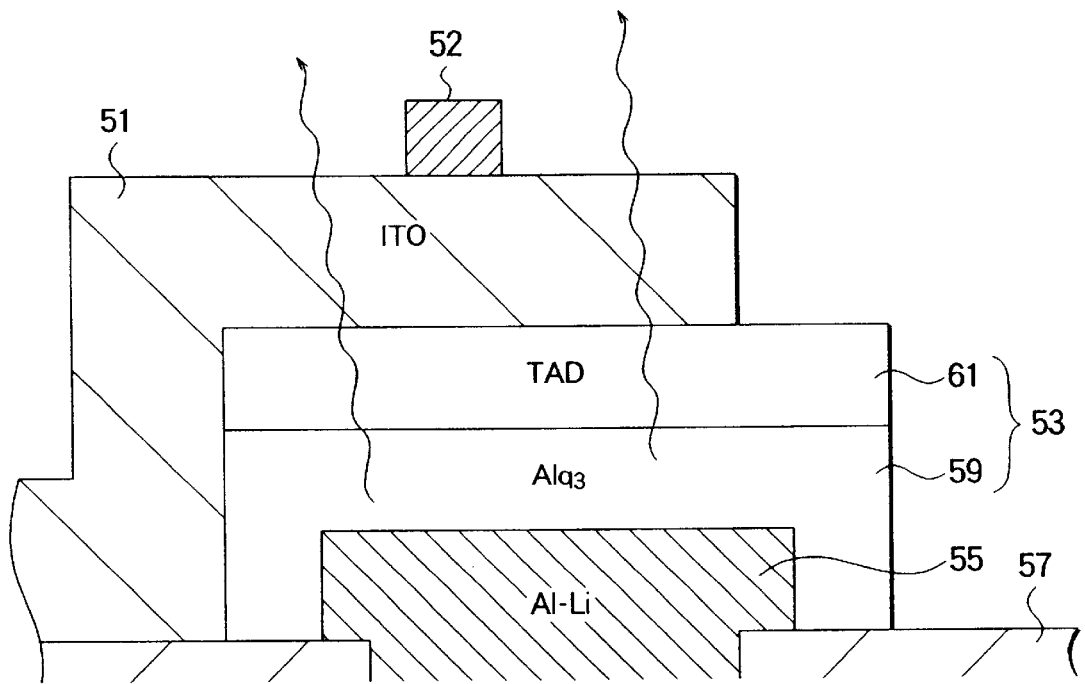
FIG. 5 is a sectional view illustrating the structure of an electroluminescent element in a first embodiment of the invented light-emitting array.

FIG. 5 is an enlarged sectional view showing the structure of the organic electroluminescent elements 50 in a first embodiment of the invention. The common electrode 51 is made of indium-tin-oxide (ITO), a well-known transparent conductive material having a large work function, with a thickness on the order of one or two tenths of a micrometer (0.1 to 0.2 $\mu$m). The common metal electrode 52 is made of, for example, aluminum. The individual electrode 55 is an aluminum-lithium alloy with a preferred thickness in the range from fifty to two hundred nanometers (50 to 200 nm). The organic EL film 53 consists of two layers: an organic electron-transport layer 59 and an organic hole-transport layer 61. The electron-transport layer 59 makes contact with the individual electrode 55, while the hole-transport layer 61 is in contact with the common electrode 51.

An electron-transport layer is a layer of a substance that readily permits the injection of electrons from an electrode having a small work function, and permits the injected electrons to move within the layer, but hinders the injection of holes, or permits the injection of holes but hinders their motion within the layer. The substance constituting the organic electron-transport layer 59 in the first embodiment is an aluminum-quinolinol complex, more specifically tris-(8-quinolinol)aluminum, abbreviated $Alq_3$ below, which is also luminescent. The electron-transport layer 59 is deposited by evaporation to a thickness of 0.05 $\mu$m.

A hole-transport layer is a layer of a substance that readily permits the injection of holes from an electrode having a large work function, and permits the injected holes to move within the layer, but hinders the injection of electrons, or permits the injection of electrons but hinders their motion within the layer. The organic hole-transport layer 61 in the first embodiment consists of a triphenylamine derivative, more specifically N,N'-diphenyl-N,N'-bis(3-methylphenyl)-1,1'-biphenyl-4,4'-diamine, abbreviated TAD below. The organic hole-transport layer 61 is deposited by evaporation to a thickness of 0.06 $\mu$m.

The first embodiment operates as follows. Referring again to FIG. 2, dot data for a row of dots are input at pad 33 and clocked into the shift register 21 in synchronization with a clock signal input at pad 31. In response to a load signal input at pad 35, the dot data are transferred to the latch circuit 23. In response to a strobe signal input at pad 37, the dot data are supplied through the logic circuit 25 to the drive circuit 27, where they activate selected drive elements (e.g. transistors) that feed current from the power supply pad 39 to the corresponding electroluminescent elements 50. The current flow is direct, the output terminals 29 being at a lower potential than the common return pads 45. The output terminals 29 and individual electrodes 55 therefore function as the cathodes of the electroluminescent elements, while the common electrode 51 functions as the anode.

Referring to FIG. 5, as a result of the potential difference across an electroluminescent element, electrons are injected from the individual electrode 55 into the electron-transport layer 59, and holes are injected from the common electrode 51 into the hole-transport layer 61. When these electrons and holes recombine in the electron-transport layer 59, they release energy which, owing to the electroluminescent properties of the aluminum-quinolinol complex of which the electron-transport layer 59 is made, is converted into light. Light is emitted from the region that lies below the common electrode 51 and above the individual electrode 55. The emitted light escapes through the hole-transport layer 61 and transparent common electrode 51, and can be used for printing or other purposes.

One advantage of the invented light-emitting array is that the potential difference required to drive the organic electroluminescent elements 50 is not large, being only about ten volts, as compared with the higher drive voltages required by conventional inorganic electroluminescent materials such as ZnS. The output terminals 29 and common return pads 45 can be placed at potentials of, for example, minus five volts and plus five volts, respectively, or the output terminals 29 can be placed at zero volts and the common return pads 45 at ten volts. The drive circuit 27 can easily be designed to withstand these voltages. There is no need to use alternating current. The driver IC 20 can be similar in design to the ICs commonly used to drive LED arrays.

Other advantages of the invented light-emitting array will be described later.

Figure 6:
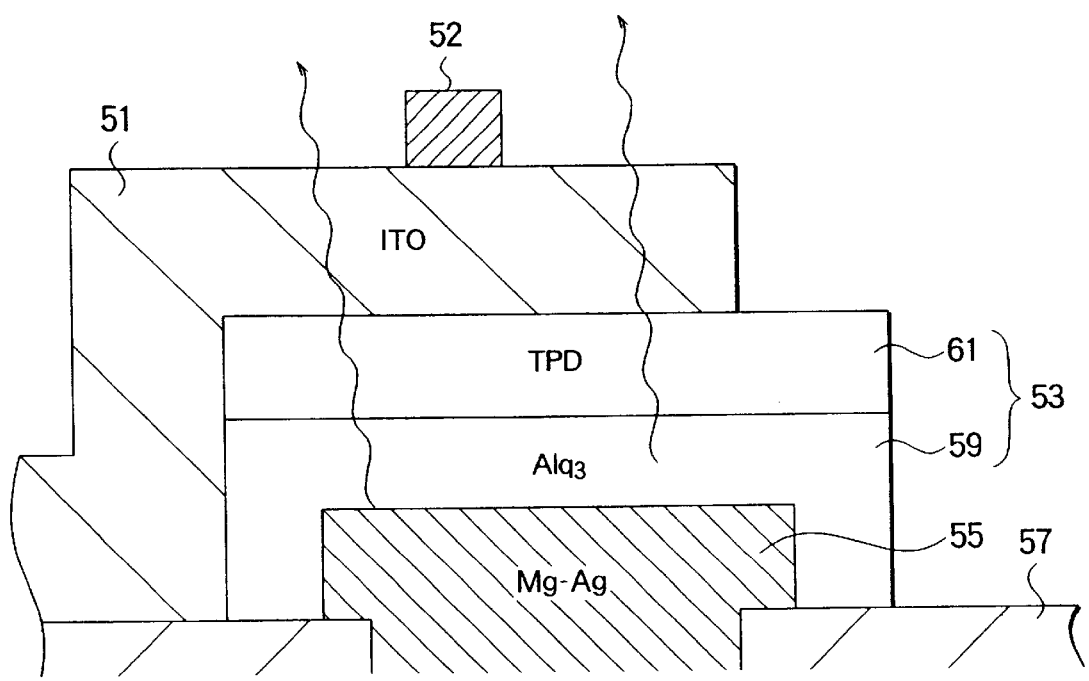
FIG. 6 illustrates the structure of an electroluminescent element in a second embodiment.

FIG. 6 shows the structure of the organic electroluminescent elements in a second embodiment of the invention. The structure is the same as in the first embodiment, except that the individual electrode 55 is a magnesium-silver film with a thickness of three hundred nanometers (300 nm), and the hole-transporting layer 61 consists of a triphenyldiamine substance (abbreviated TPD). Operation is the same as in the first embodiment. The second embodiment has produced optical brightness values on the order of $10^5$ $cd/m^2$, when driven at voltages in the range from five to ten volts.

Figure 7:
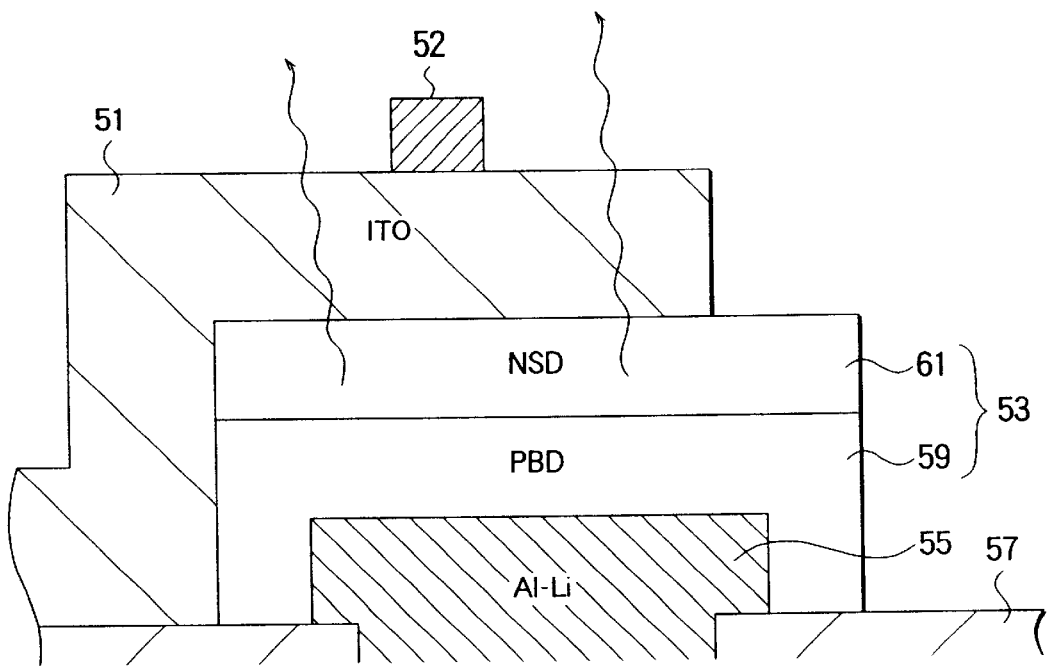
FIG. 7 illustrates the structure of an electroluminescent element in a third embodiment.

FIG. 7 shows the structure of the organic electroluminescent elements in a third embodiment. The organic electron-transport layer 59 now consists of an oxadiazole derivative, more specifically the substance 2-(4-Biphenylyl)-5-(4-tert-butylphenyl)-1,3,4-oxadiazole, abbreviated PBD, which is non-luminescent. The hole-transport layer 61 consists of a triphenylamine derivative, more specifically the substance N,N-bis(4-methoxyphenyl)-4-[2-(1-naphthalenyl)ethenyl]-Benzenamine, abbreviated NSD, which is luminescent. Operation is as in the first embodiment, except that light is now emitted from the hole-transport layer 61 instead of from the electron-transport layer 59.

Figure 8:
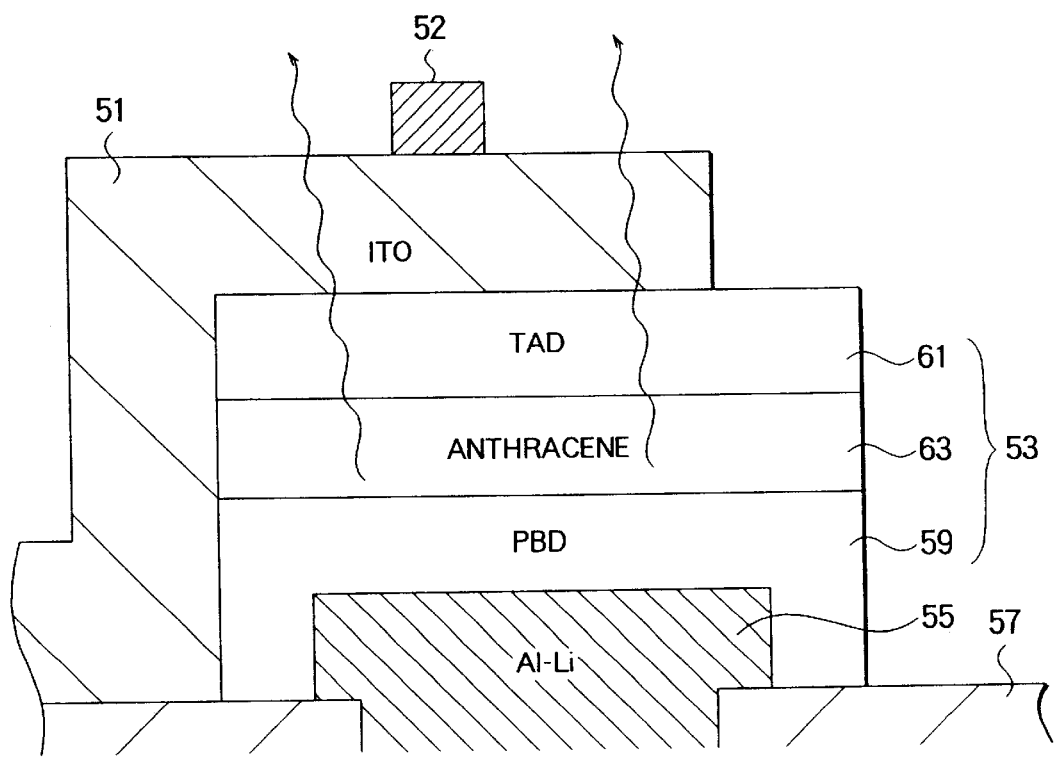
FIG. 8 illustrates the structure of an electroluminescent element in a fourth embodiment.

FIG. 8 shows the structure of the organic electroluminescent elements in a fourth embodiment. The electron-transport layer 59 consists of PBD, as in the third embodiment. The hole-transport layer 61 consists of TAD, as in the first embodiment. Neither of these layers is luminescent, so an organic light-emitting layer 63 is inserted between them. The organic light-emitting layer 63 comprises anthracene, a substance that possesses bipolar mobility: the property of transporting both electrons and holes to the same degree. Operation is similar to the preceding embodiments. Electrons and holes are transported through layers 59 and 61, respectively, and recombine in the light-emitting layer 63, causing emission of light.

As the preceding embodiments show, the invention can be practiced with a variety of organic light-emitting substances, including substances with electron mobility, substances with hole mobility, and substances with bipolar mobility.

Figure 9:
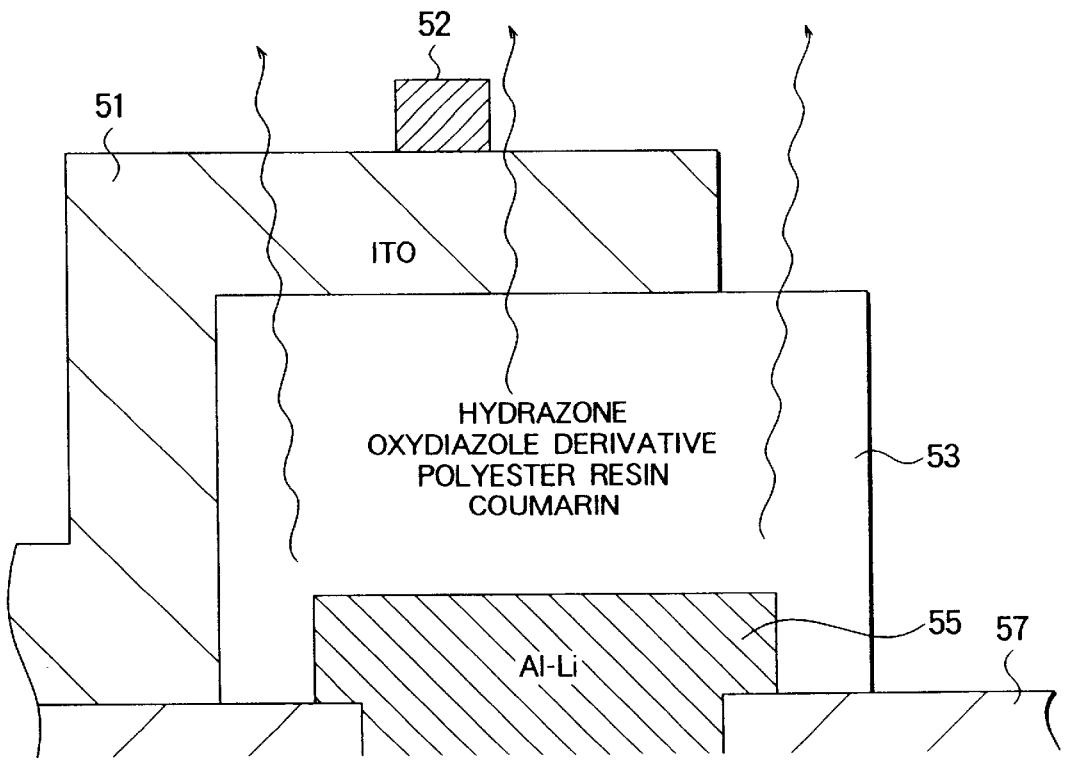
FIG. 9. illustrates the structure of an electroluminescent element in a fifth embodiment.

FIG. 9 shows the structure of the organic electroluminescent elements in a fifth embodiment. The organic EL film 53 now comprises a single layer in which an electron-transporting organic compound, a hole-transporting organic compound, and a light-emitting organic compound are mixed together. The electron-transporting organic compound is an oxydiazole derivative, more specifically (2,5-bis-naphthyl-1,3,4-oxadiazole). The hole-transporting organic compound is hydrazone. The light-emitting organic compound is a polyester resin with an admixture of coumarin, a dye employed in lasers. These substances were selected to satisfy necessary conditions for balanced injection of electrons and holes, and for carrier recombination. The overall thickness of this organic EL film 53 is 0.2 $\mu$m.

The fifth embodiment operates like the preceding embodiments, and has been found to give adequate emission of light. The mixed layer can be formed by dip-coating, using a solution of the above organic components with a gravimetric ratio of 1:1:1:0.05, that is, twenty parts oxydiazole derivative, twenty parts hydrazone, twenty parts polyester resin, and one part coumarin.

Hydrazone, incidentally, could also be used for the non-luminescent hole-transport layer in layered films such as those in the first, second, and fourth embodiments.

Figure 10:
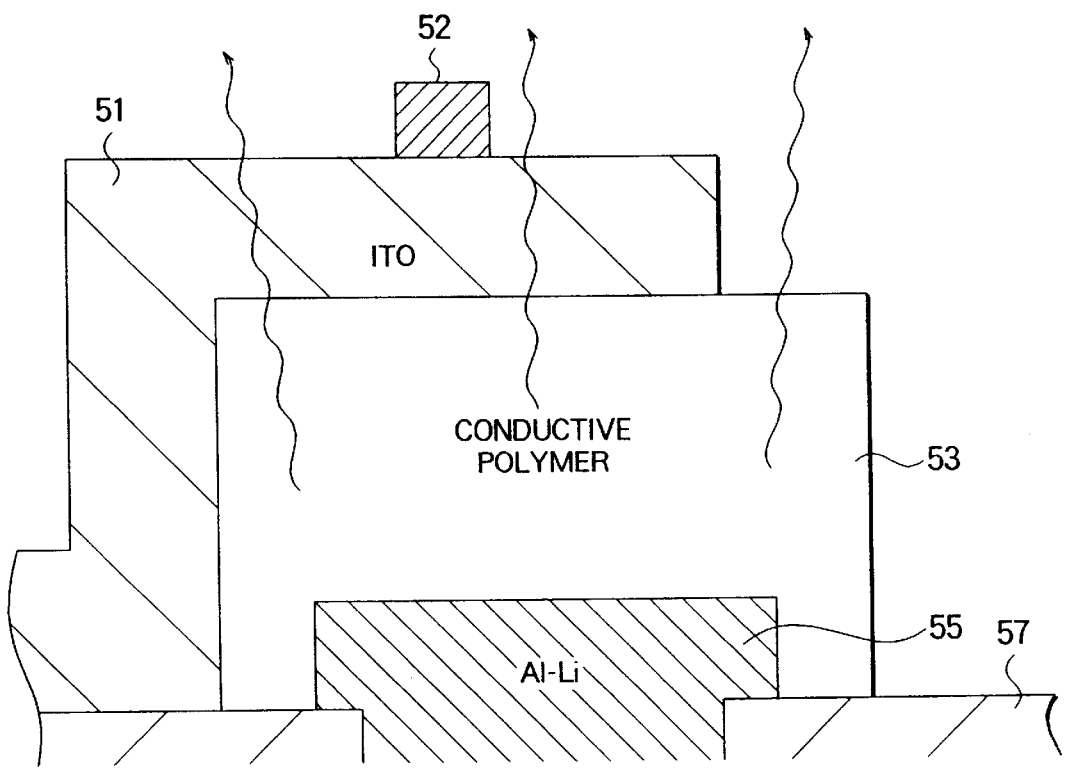
FIG. 10 illustrates the structure of an electroluminescent element in a sixth embodiment.

FIG. 10 shows the structure of the organic electroluminescent elements in a sixth embodiment. The organic EL film 53 in this embodiment consists of a single conductive polymer layer, more specifically a layer of poly(3-octadecylthiophene) with a thickness of 0.2 $\mu$m, formed by spin-coating. This material appears to give well-balanced injection of electrons and holes from the individual electrode 55 and common electrode 51, respectively, and provides adequate emission of light.

Figure 11:
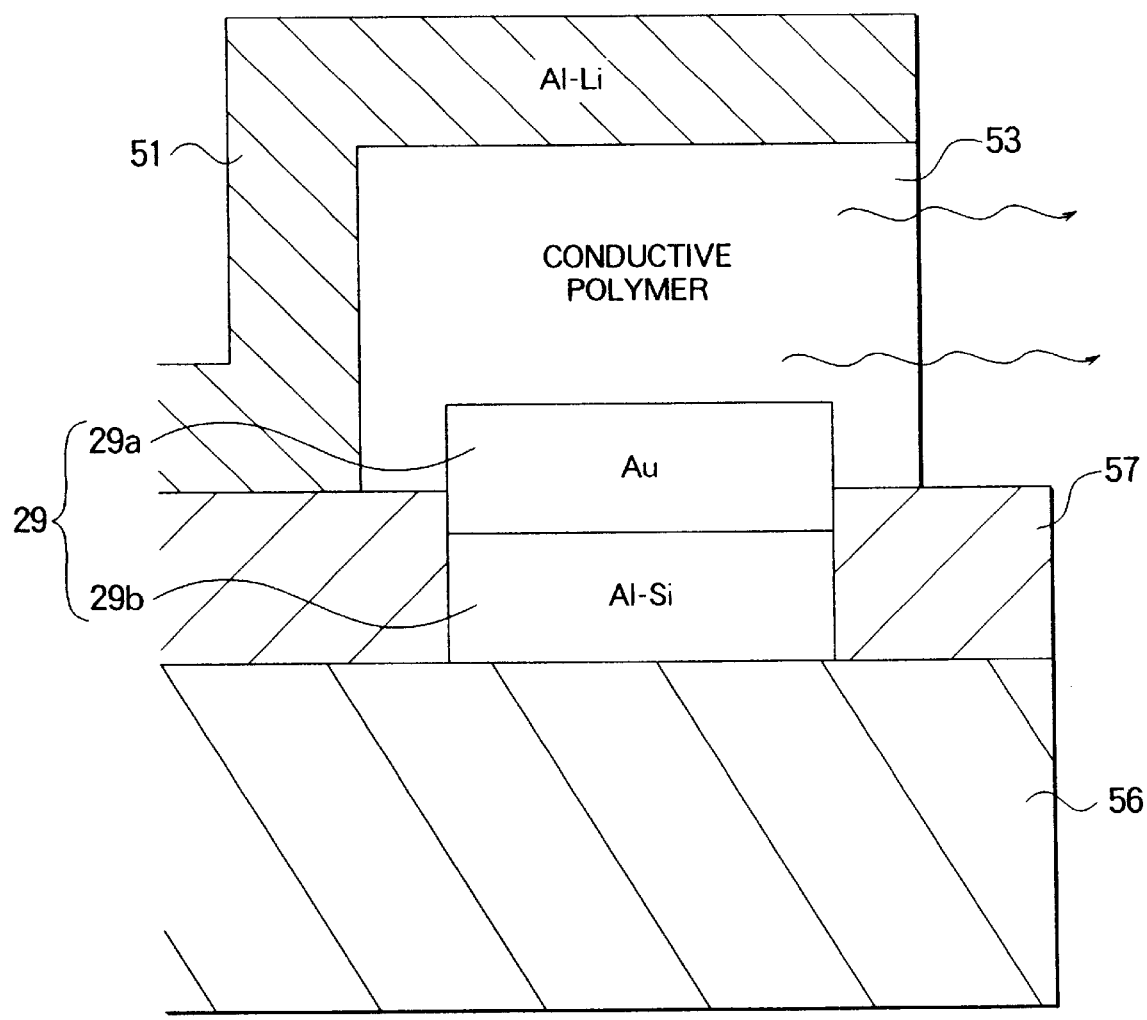
FIG. 11 illustrates the structure of an electroluminescent element in a seventh embodiment.

FIG. 11 shows the structure of the organic electroluminescent elements in a seventh embodiment. This embodiment differs from the previous embodiments in that light is emitted from the edges of the organic electroluminescent elements. The organic EL film 53 comprises a conductive polymer as in the sixth embodiment.

In an edge-emitting array, the common electrode 51 does not have to be transparent, so it need not be made of a material such as ITO having a large work function. A material such as an aluminum-lithium alloy (as shown in the drawing), or a magnesium-silver alloy, which has a small work function, can be employed in the common electrode 51, and a material such as gold, which has as large work function, can be employed in the output terminal 29. For example, the output terminal 29 can comprise a lower layer 29b of aluminum-silicon and an upper layer 29a of gold, as shown in the drawing. Alternatively, the entire output terminal 29 could be made of gold.

In either case, no individual electrode 55 is required; the organic EL film 53 can make contact directly with the output terminal 29. The common metal electrode 52 is also unnecessary. When the common electrode 51 is made of the comparatively high-resistance material ITO, as in the first six embodiments, supplying driving current through the common electrode 51 alone, without the common metal electrode 52, would lead to an undesired voltage drop at intermediate points between the common return pads 45. When the common electrode 51 is made of a low-resistance material such as an aluminum-lithium or magnesium-silver alloy, however, as in the seventh embodiment, less voltage drop occurs, and the common metal electrode 52 can be omitted.

The seventh embodiment operates like the sixth embodiment, except that light is emitted sideways from the edge of the organic EL film 53, and the electrical polarity is reversed. Since the gold surface layer 29a of the output terminal 29 has a large work function and the magnesium-silver common electrode 51 has a small work function, the output terminal 29 is now driven at a higher voltage than the common electrode 51, so that the common electrode 51 is the cathode and supplies electrons, while the output terminal 29 is the anode and supplies holes.

Next, steps in the fabrication of the invented light-emitting array will be described.

Figure 12:
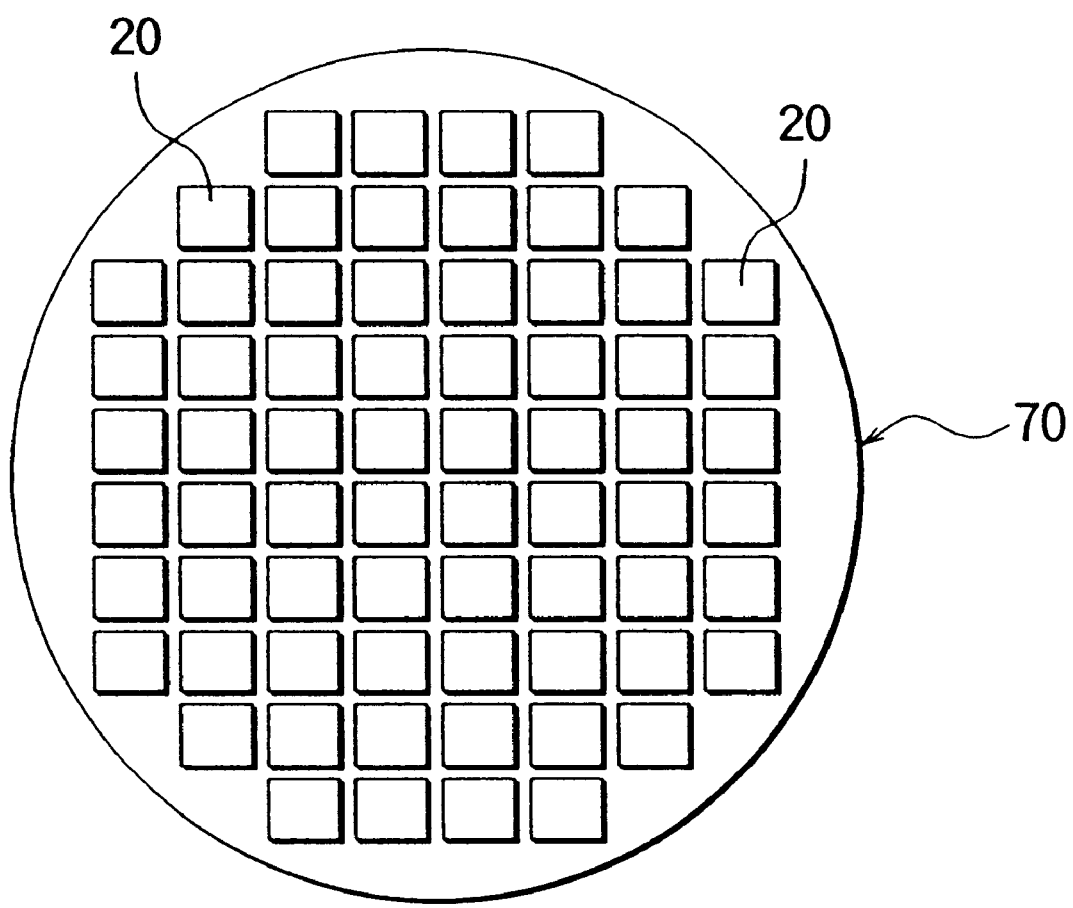
FIG. 12 illustrates a step in a fabrication process for the invented light-emitting array.

Referring to FIG. 12, a large number of identical driver ICs 20 are first fabricated in a semiconductor wafer 70. The wafer 70 is preferably a silicon wafer. Various fabrication processes and circuit technologies are available, such as the well-known complementary metal-oxide-semiconductor (CMOS), bipolar, or bipolar metal-oxide-semiconductor (biMOS) technologies. Fabrication of the driver ICs 20 includes formation of the output terminals 29, protective layer 57, common return pads 45, and the other pads that were shown in FIGS. 1 to 4.

Figure 13:
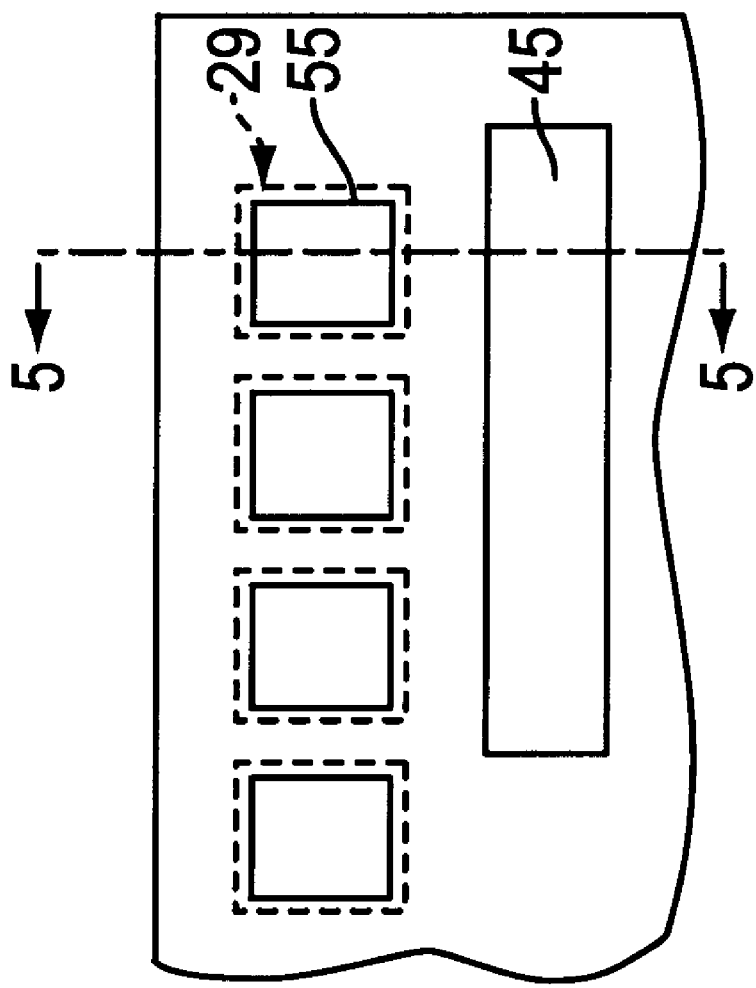
FIG. 13 illustrates another step in this fabrication process.
Figure 14:
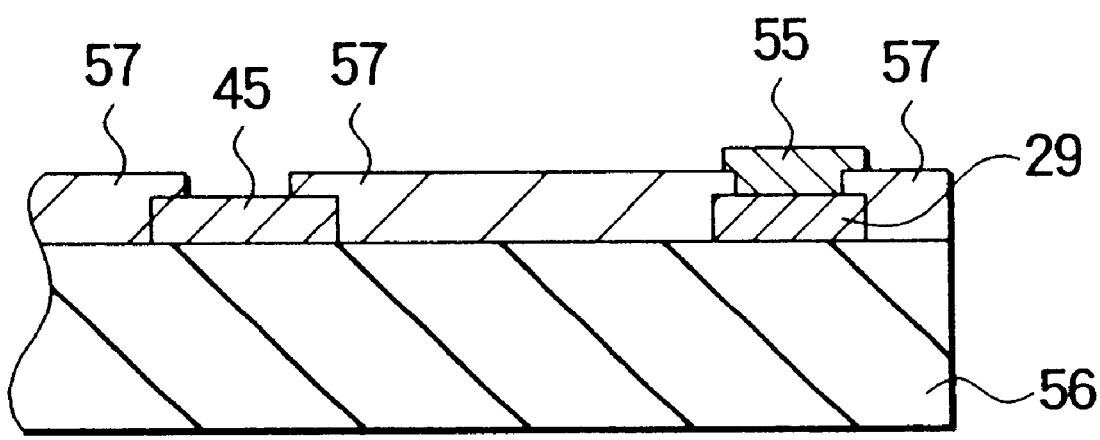
FIG. 14 is a sectional view through line 5—5 in FIG. 7.

Referring to FIGS. 13 and 14, next the individual electrodes 55 are created, using a standard photolithographic lift-off technique. Specifically, the wafer 70 is coated with a photoresist (not shown), which is patterned to create windows at the sites where the individual electrodes 55 are to be formed. A thin film of the electrode material (e.g. an aluminum-lithium or magnesium-silver alloy, or gold) is next deposited over the entire wafer 70. The patterned photoresist is then lifted off, leaving the desired individual electrodes 55. FIG. 13 shows the result in plan view, while FIG. 14 shows a sectional view through line 5—5 in FIG. 13.

Figure 15:
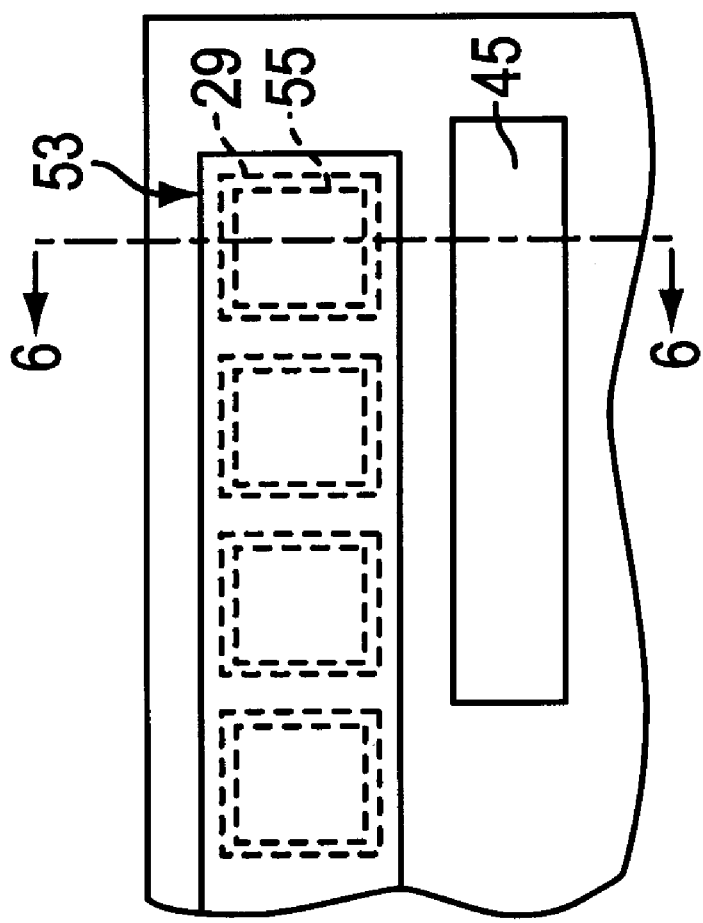
FIG. 15 illustrates another step in the same fabrication process.
Figure 16:
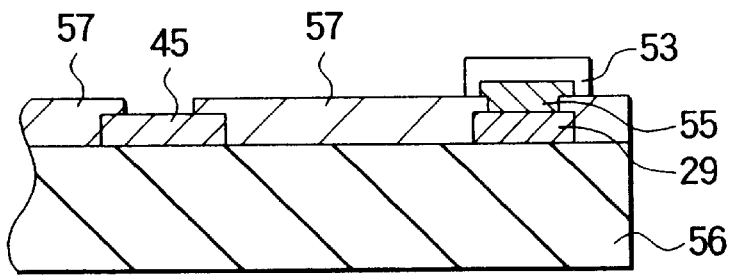
FIG. 16 is a sectional view through line 6—6 in FIG. 9.

Referring to FIGS. 15 and 16, next the organic EL film 53 is created, using a similar lift-off technique. The wafer 70 is coated with another photoresist (not shown) which is patterned to leave a window in the desired shape of the organic EL film 53 on each driver IC 20. The layer or layers constituting the organic EL film 53 are then formed over the entire surface of the wafer 70.

In the first embodiment, for example, layers of $ALq_3$ and TAD can be successively deposited by the resistive-heating evaporation deposition method under vacuum conditions, the ambient pressure not exceeding $10^{-3}$ Pascals. The wafer 70 need not be heated or cooled. Similar layer deposition processes can be used in the second, third, and fourth embodiments. The single organic layer in the fifth or sixth embodiment can be formed by dip-coating or spin-coating, as mentioned earlier.

After formation of the organic layer or layers, the photoresist is lifted off, leaving the desired organic EL film 53.

FIG. 15 shows the result in plan view, while FIG. 16 shows a sectional view through line 6—6 in FIG. 15.

Next, similar processes are used to create the common electrode 51 and common metal electrode 52 (if present). For each of these electrodes, yet another resist pattern (not shown) is formed and patterned to leave a window in the desired shape on each driver IC 20; an ITO film or metal film is deposited on the entire wafer, e.g. by evaporation under vacuum conditions; then the resist is lifted off, leaving the result shown earlier in FIGS. 3 and 4.

Figure 17:
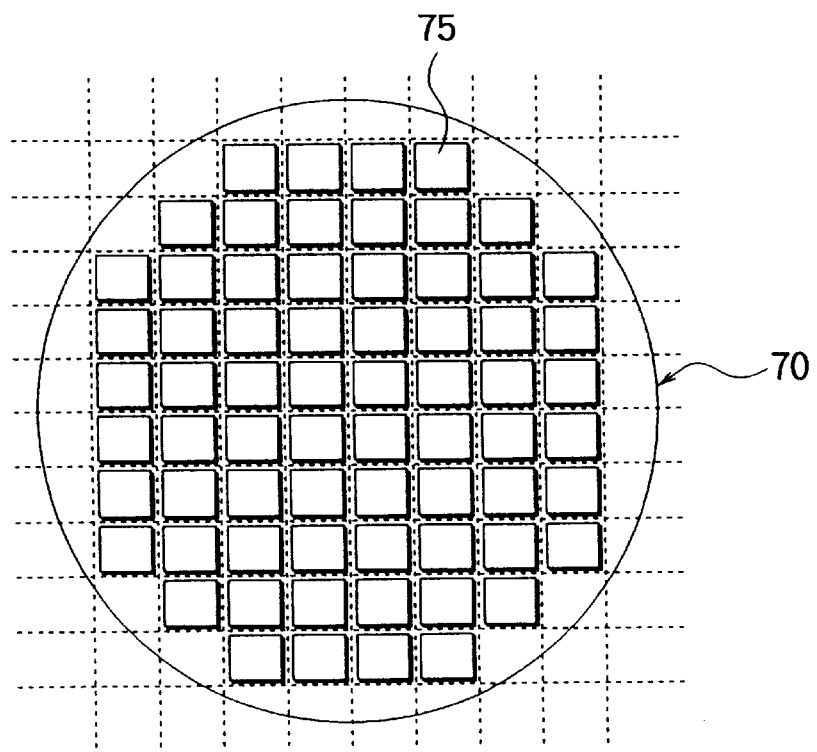
FIG. 17 illustrates a final fabrication step.

Finally, the wafer 70 is diced along the dotted lines shown in FIG. 17, each resulting die being a completed organic light-emitting array 75 with integral driving circuits.

The above process uses only standard, well-known IC fabrication techniques. An advantage of this process over the fabrication of LED arrays is that large-diameter silicon wafers, from which a large number of individual devices can be obtained, are available, so the unit cost of each device can be comparatively low.

Next an alternative fabrication process will be described. This alternative process differs from the process described above only in the patterning of the organic EL film 53 and common electrodes 51.

Figure 18:
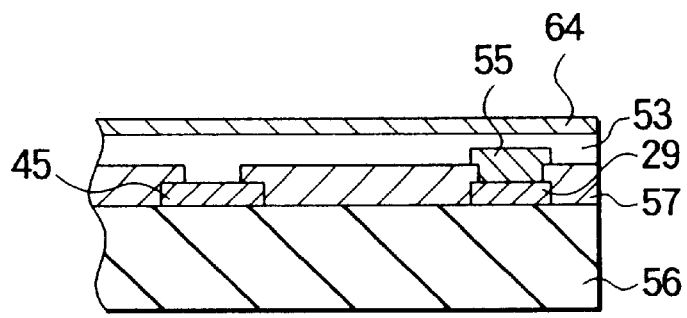
FIG. 18 illustrates a step in an alternative fabrication process for the invented light-emitting array.

Referring to FIG. 18, in the alternative process, after the organic EL film 53 has been deposited or coated onto the entire surface of the wafer, a conductive film 64 comprising, for example, ITO or an aluminum-lithium alloy is deposited on the entire surface of the organic EL film 53. The organic EL film 53 and conductive film 64 are then patterned simultaneously, as follows. First, a photoresist (not shown) is coated onto the wafer over the conductive film 64 and patterned. Next, the parts of the conductive film 64 and organic EL film 53 not protected by the photoresist are removed by, for example, dry etching. Finally, the photoresist pattern is removed, leaving the configuration shown in FIG. 19. The remaining part of the conductive film 64 becomes the common electrode 51.

Figure 19:
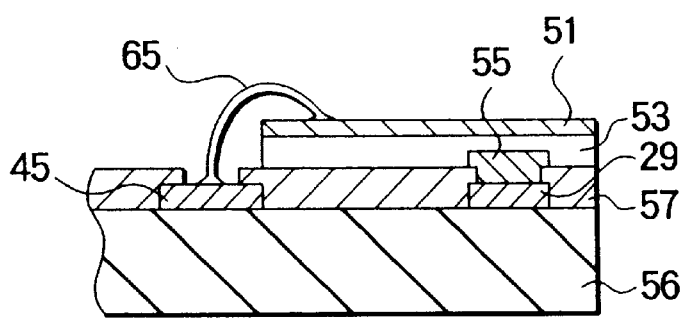
FIG. 19 illustrates another step in this alternative fabrication process.

This process does not create an electrical connection between the common electrode 51 and common return pads 45. If the common electrode 51 comprises a material suitable for wire bonding, however, such as the aluminum-lithium or magnesium-silver alloy of the seventh embodiment, the common electrode 51 can be coupled to the common return pads 45 by attaching bonding wires 65 as shown in FIG. 19. The wire bonding can be performed together with other wire bonding after the wafer has been diced, when the individual arrays are installed.

Figure 20:
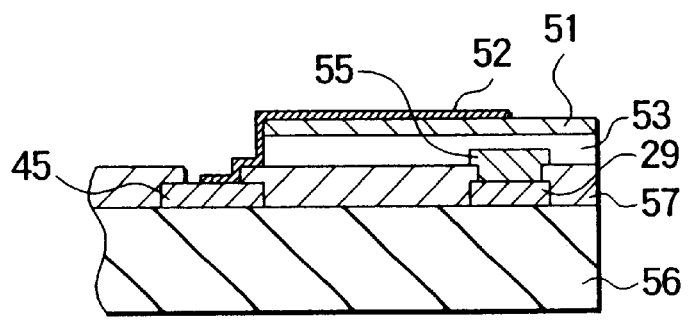
FIG. 20 illustrates a variation of the alternative fabrication process.

Referring to FIG. 20, if the common electrode 51 comprises ITO or another material not suited for wire bonding, as in the first six embodiments, the electrical connection to the common return pads 45 can be effected by means of the common metal electrode 52 described earlier. The common metal electrode 52 is patterned so as to extend onto the common return pads 45, as well as forming a stripe on the common electrode 51.

The alternative fabrication process has the advantage of requiring fewer photolithography steps, since the organic EL film 53 and common electrode 51 are patterned simultaneously.

Figure 21:
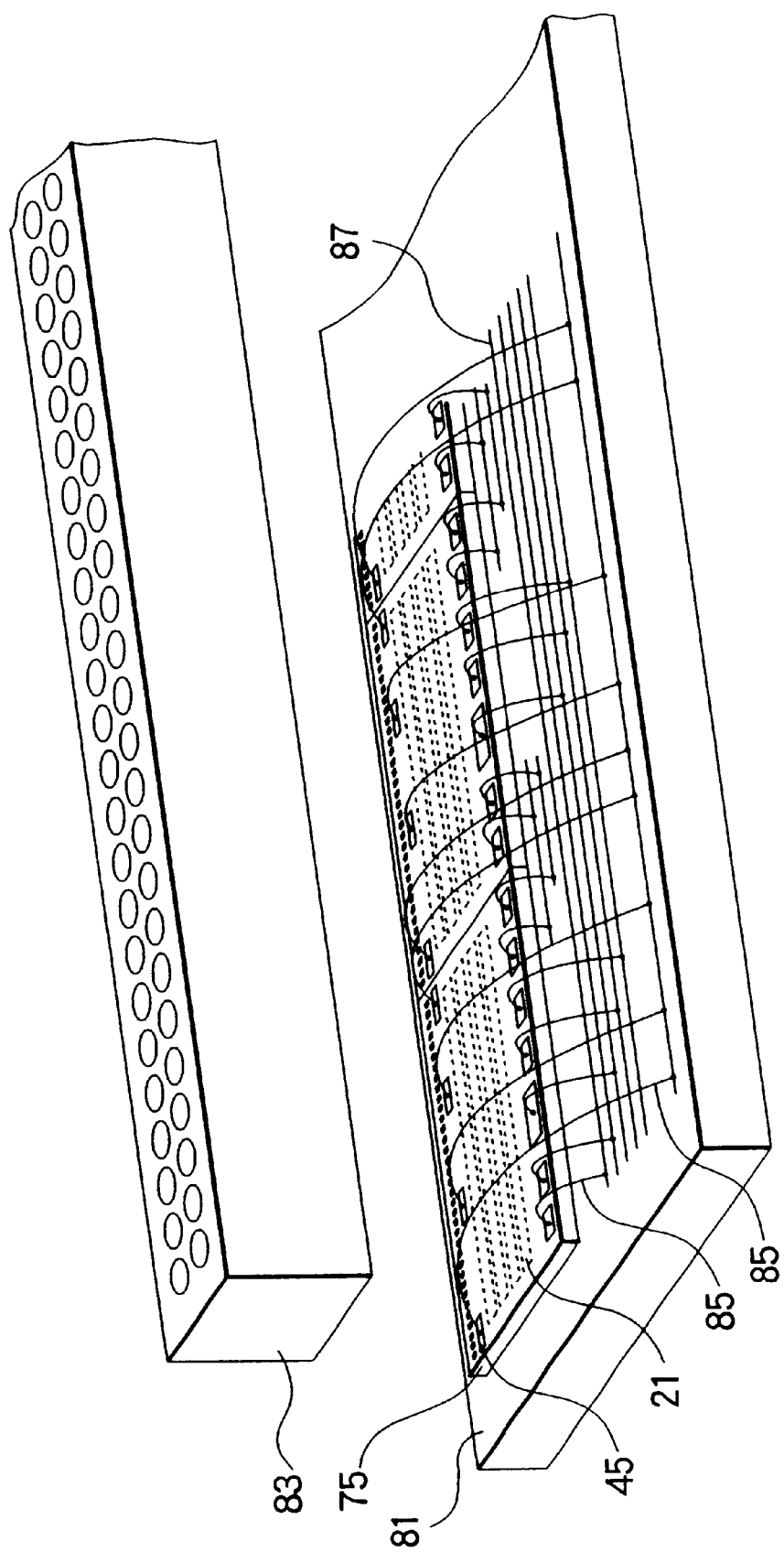
FIG. 21 is a perspective view of the main parts of the invented optical head assembly.

Next the invented optical head assembly will be described, with reference to FIG. 21, which shows the main parts of the head assembly in perspective view.

The optical head assembly comprises a printed circuit board 81 of, for example, the common glass-epoxy type, on which are mounted a plurality of organic electroluminescent light-emitting arrays 75 of the type shown in any of the preceding embodiments. The arrays 75 are die-bonded to the printed circuit board 81 in an end-to-end configuration, so that their electroluminescent elements are arranged in a single linear array. A lens array 83 is mounted facing the array of electroluminescent elements, to focus the emitted light. (The mounting structure of the lens array 83 has been omitted to simplify the drawing.) The lens array 83 depicted in FIG. 21 is of the well-known self-focusing (selfoc) type, but the invention is not restricted to any particular type of lens array. In some applications the lens array is unnecessary, and can be omitted.

The common return pads 45 and other pads on the organic light-emitting arrays 75 are coupled by bonding wires 85 (made of gold, for example) to printed wiring traces 87 on the printed circuit board 81. These traces 87 supply power and signals to the light-emitting arrays 75. The clock and data output pads of each light-emitting array 75 are coupled by the bonding wires and traces to the clock and data input pads of the next array 75, so that dot data can be shifted serially through all the shift registers 21 in the arrays.

A detailed description of the operation of the invented optical head assembly will be omitted. Suffice it to say that electrical power and signals are provided from the traces 87 on the printed circuit board 81 to the light-emitting arrays 75, which respond by emitting light in a linear pattern of dots, and that the dots are focused by the lens array 83.

One advantage of the invented optical head assembly, as compared with a conventional LED head, is that it requires relatively little wire bonding. No bonding wires are needed to connect the light-emitting elements to their drive circuits. This reduces the cost of manufacturing the optical head assembly, and improves its reliability by reducing the risk of short circuits between bonding wires.

Another advantage is a reduced parts count and reduced amount of die bonding, again as compared with a conventional LED head, because the light-emitting elements and their driving circuits are on the same dies. This further reduces the cost of manufacturing the optical head assembly, and reduces its size. When the light-emitting arrays are fabricated from large-diameter silicon wafers, the parts count and hence the manufacturing cost of the optical head assembly can be reduced still further by making the individual arrays themselves large, so that fewer of them are needed to obtain a combined array of a given total width.

Yet another advantage over a conventional LED head is that extremely high dot resolutions can be achieved. Since the dot pitch is not limited by the need to allow space between bonding wires, the electroluminescent elements can be placed as close together as their size permits. Dot resolutions in excess of one thousand two hundred dots per inch (1200 DPI) can be anticipated. Photolithography can define features smaller than one micrometer (1 $\mu$m), so dot resolutions exceeding ten thousand dots per inch may be within reach.

The invention is not restricted to the materials and methods described in the embodiments above. Other electron-transporting luminescent substances may be used in the organic EL film 53, for example, including porphyrin and various other metallic complexes, beryllium-benzoquinolinol, cyclopentadiene derivatives, and perylene derivatives, to name just a few. Other possible hole-transporting substances include, for example, triphenylmethane, oxadiazole, pyrazoline, and polyvinyl carbazole substances.

In selecting organic electroluminescent compounds, the guidelines should be high brightness, high efficiency, long life, and suitability for fine patterning. Small amounts of dye substances can be added, as coumarin was added in the fifth embodiment, to improve electroluminescent efficiency, or to match the emitted wavelength of light to the sensitive band of the material to be illuminated (e.g. the photosensitive drum in an electrophotographic printer).

Thin films of the selected organic compounds can be formed by vacuum evaporation, dip-coating, or spin-coating as mentioned above, or by other methods such as organic molecular beam deposition (OMBD), plasma polymerization, micellar electrolysis, or the Langmuir-Blodgett method, depending on design considerations.

Although silicon is preferred as the semiconductor material of the driver IC, this is not a restriction. Other semiconductor materials that could be used include gallium arsenide (GaAs), indium phosphide (InP), aluminum-gallium arsenide (AlGaAs), and gallium phosphide (GaP).

While the seventh embodiment employed the same organic EL film 53 as the sixth embodiment, similar edge-emitting arrays can be fabricated using any of the organic EL films shown in the first five embodiments. If the driving polarity is reversed as in the seventh embodiment, then the order of layers in these films 53 should also be reversed. Those skilled in the art will recognize that various further modifications are possible within the scope of the invention as claimed below.

What is claimed is:

1. A light-emitting array, comprising:
    a silicon semiconductor substrate having a surface;
    a plurality of output terminals formed on said surface;
    a plurality of organic electroluminescent elements formed on said surface over respective output terminals, in electrical contact with respective output terminals;
    driving circuitry formed in said silicon semiconductor substrate and coupled to said output terminals, for supplying direct current to each of said output terminals and switching said direct current on and off at each of said output terminals, thereby switching said organic electroluminescent elements individually on and off, said driving circuitry comprising:
        a shift register for receiving dot data;
        a latch circuit for storing the dot data received by said shift register;
        a logic circuit for controllably outputting contents of said latch circuit; and
        a drive circuit for supplying said direct current to said output terminals responsive to said contents of said latch circuit as output by said logic circuit;
    at least one common return terminal formed on said surface;
    a common transparent electrode coupled to all of said electroluminescent elements and to said common return terminal, for returning said direct current to said common return terminal, light being emitted through said common transparent electrode from surfaces of respective electroluminescent elements; and
    a common metal electrode formed on said common transparent electrode and coupled to said common return terminal, said common metal electrode leaving said organic electroluminescent elements exposed for emitting said light through said common transparent electrode.

2. The light-emitting array of claim 1, wherein said output terminals are disposed in a linear array.

3. The light-emitting array of claim 1, comprising a pair of common return terminals as described in claim 1, disposed at opposite ends of said common transparent electrode, both of said common return terminals being coupled to said common transparent electrode.

4. The light-emitting array of claim 3, comprising at least one additional common return terminal coupled to said common transparent electrode at a point between said pair of common return terminals.

5. The light-emitting array of claim 1, wherein said common metal electrode is formed as a longitudinal stripe on said common transparent electrode.

6. The light-emitting array of claim 1, wherein said electroluminescent elements have respective individual electrodes making contact with respective output terminals.

7. The light-emitting array of claim 6, wherein said individual electrodes comprise an aluminum-lithium alloy.

8. The light-emitting array of claim 6, wherein said individual electrodes comprise a magnesium-silver alloy.

9. The light-emitting array of claim 1, wherein said output terminals have a larger work function than does said common electrode.

10. The light-emitting array of claim 9, wherein said output terminals comprise gold.

11. The light-emitting array of claim 9, wherein said common electrode comprises an aluminum-lithium alloy.

12. The light-emitting array of claim 9, wherein said common electrode comprises a magnesium-silver alloy.

13. The light-emitting array of claim 1, wherein each of said electroluminescent elements comprises:

an electron-transport layer for conducting electrons as one part of said direct current; and a hole transport layer for conducting holes as another part of said direct current.

14. The light-emitting array of claim 13, wherein said electron-transport layer comprises a substance that converts energy, obtained from recombination of said electrons and holes, into light.

15. The light-emitting array of claim 14, wherein said electron-transport layer comprises an aluminum-quinolinol complex.

16. The light-emitting array of claim 14, wherein said hole transport layer comprises a triphenyl amine derivative.

17. The light-emitting array of claim 14, wherein said hole transport layer comprises a triphenyldiamine substance.

18. The light-emitting array of claim 13, wherein said hole-transport layer comprises a substance that converts energy, obtained from recombination of said electrons and holes, into light.

19. The light-emitting array of claim 18, wherein said electron-transport layer comprises an oxadiazole derivative.

20. The light-emitting array of claim 18, wherein said hole transport layer comprises a triphenylamine derivative.

21. The light-emitting array of claim 13, wherein each of said electroluminescent elements also has a light-emitting layer disposed between said electron-transport layer and said hole transport layer, for converting energy obtained from recombination of said electrons and holes into light.

22. The light-emitting array of claim 21, wherein said light-emitting layer comprises anthracene.

23. The light-emitting array of claim 1, wherein each of said electroluminescent elements comprises an electron-transporting organic compound, a hole-transporting organic compound, and a light-emitting organic compound mixed together in a single layer.

24. The light-emitting array of claim 23, wherein said electron-transporting organic compound is an oxydiazole derivative.

25. The light-emitting array of claim 23, wherein said hole-transporting organic compound is hydrazone.

26. The light-emitting array of claim 23, wherein said light-emitting organic compound is a polyester resin.

27. The light-emitting array of claim 26, wherein a dye substance is added to said polyester resin.

28. The light-emitting array of claim 1, wherein each of said electroluminescent elements comprises a conductive polymer.

29. The light-emitting array of claim 28, wherein said conductive polymer is poly(3-octadecylthiophene).

30. An optical head assembly, comprising:

a printed circuit board;

at least one integrated circuit attached to said printed circuit board, said integrated circuit comprising a silicon semiconductor substrate having driving circuitry formed therein and a surface, said surface having formed thereon a plurality of output terminals and at least one common return terminal, said driving circuitry for controllably supplying direct current to each of said output terminals, said driving circuitry comprising:

a shift register for receiving dot data;

a latch circuit for storing the dot data received by said shift register;

a logic circuit for controllably outputting contents of said latch circuit; and a drive circuit for supplying said direct current to said output terminals responsive to said contents of said latch circuit as output by said logic circuit;

a plurality of organic electroluminescent elements formed on said integrated circuit over respective output terminals and making electrical contact with said respective output terminals, for emitting light responsive to said direct current;

a common transparent electrode coupled to all of said electroluminescent elements and to said common return terminal, for returning said direct current to said common return terminal, light being emitted through said common transparent electrode from surfaces of respective electroluminescent elements; and a common metal electrode formed on said common transparent electrode, said common metal electrode leaving said organic electroluminescent elements exposed for emitting said light through said common transparent electrode.

31. The optical head assembly of claim 30, wherein each of said electroluminescent elements comprises:

an electron-transport layer for conducting electrons as one part of said direct current; and a hole transport layer for conducting holes as another part of said direct current.

32. The optical head assembly of claim 31, wherein said electron-transport layer comprises a substance that converts energy, obtained from recombination of said electrons and holes, into light.

33. The optical head assembly of claim 31, wherein said hole-transport layer comprises a substance that converts energy, obtained from recombination of said electrons and holes, into light.

34. The optical head assembly of claim 31, wherein each of said electroluminescent elements also has a light-emitting layer disposed between said electron-transport layer and said hole transport layer, for converting energy obtained from recombination of said electrons and holes into light.

35. The optical head assembly of claim 30, wherein each of said electroluminescent elements comprises an electron-transporting organic compound, a hole-transporting organic compound, and a light-emitting organic compound mixed together in a single layer.

36. The optical head assembly of claim 30, wherein each of said electroluminescent elements comprises a conductive polymer.

* * * * *